(12) United States Patent
Wang

(10) Patent No.: US 9,697,760 B2
(45) Date of Patent: Jul. 4, 2017

(54) PIXEL STRUCTURE AND DISPLAY METHOD THEREOF, AND DISPLAY DEVICE

(71) Applicant: BOE TECHNOLOGY GROUP CO., LTD., Beijing (CN)

(72) Inventor: Hongli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/769,610

(22) PCT Filed: Jan. 20, 2015

(86) PCT No.: PCT/CN2015/071097
§ 371 (c)(1),
(2) Date: Aug. 21, 2015

(87) PCT Pub. No.: WO2016/050018
PCT Pub. Date: Apr. 7, 2016

(65) Prior Publication Data
US 2016/0253943 A1    Sep. 1, 2016

(30) Foreign Application Priority Data

Sep. 30, 2014    (CN) .......................... 2014 1 0521724

(51) Int. Cl.
*G09G 3/20*     (2006.01)
*G09G 3/3208*   (2016.01)
*H01L 27/32*    (2006.01)

(52) U.S. Cl.
CPC ......... *G09G 3/2003* (2013.01); *G09G 3/3208* (2013.01); *H01L 27/3218* (2013.01);
(Continued)

(58) Field of Classification Search
None
See application file for complete search history.

(56) References Cited

U.S. PATENT DOCUMENTS 8,754,914 B2 * 6/2014 Lu ........................ G09G 3/3648
345/694
2002/0109457 A1    8/2002 Duineveld et al.
(Continued)

FOREIGN PATENT DOCUMENTS

CN    102625132 A    8/2012
CN    102855834 A    1/2013
(Continued)

OTHER PUBLICATIONS

Written Opinion of the International Searching Authority dated Jun. 30, 2015 corresponding to International application No. PCT/CN2015/071097.
(Continued)

*Primary Examiner* — Kenneth B Lee, Jr.
(74) *Attorney, Agent, or Firm* — Nath, Goldberg & Meyer; Joshua B. Goldberg; Annie Kock

(57) ABSTRACT

The invention provides a pixel structure and a display method thereof, and a display device including the pixel structure. The pixel structure comprises first pixel units and second pixel units which are sequentially arranged in staggered positions, wherein the first pixel unit comprises a first sub-pixel and a second sub-pixel arranged in an oblique line, and the second pixel unit comprises a third sub-pixel and a fourth sub-pixel arranged in an oblique line, and wherein the first sub-pixel and the third sub-pixel have different basic colors, and the second sub-pixel and the fourth sub-pixel have the same basic color.

20 Claims, 5 Drawing Sheets

(52) U.S. Cl.
CPC . *G02F 2201/52* (2013.01); *G09G 2300/0452* (2013.01); *G09G 2300/0465* (2013.01); *G09G 2320/0242* (2013.01)

(56) References Cited

U.S. PATENT DOCUMENTS

2012/0050345 A1    3/2012   Higashi et al.
2013/0234917 A1*   9/2013   Lee .................... H01L 27/3218
                                                                         345/82

FOREIGN PATENT DOCUMENTS

| CN | 103311266 A | 9/2013 |
|---|---|---|
| CN | 203260586 U | 10/2013 |
| CN | 103680325 A | 3/2014 |
| CN | 103680398 A | 3/2014 |
| CN | 103714751 A | 4/2014 |
| CN | 103778882 A | 5/2014 |
| CN | 103943656 A | 7/2014 |
| CN | 104051493 A | 9/2014 |
| CN | 104282727 A | 1/2015 |
| CN | 204102903 U | 1/2015 |

OTHER PUBLICATIONS

Notification of the First Office Action dated Aug. 3, 2016 corresponding to Chinese application No. 201410521724.0.

* cited by examiner

PIXEL STRUCTURE AND DISPLAY METHOD THEREOF, AND DISPLAY DEVICE

This is a National Phase Application filed under 35 U.S.C. 371 as a national stage of PCT/CN2015/071097, filed Jan. 20, 2015, an application claiming the benefit of Chinese Application No. 201410521724.0, filed Sep. 30, 2014, the content of each of which is hereby incorporated by reference in its entirety.

FIELD OF THE INVENTION

The present invention belongs to the technical field of display, and specifically relates to a pixel structure and a display method thereof, and a display device.

BACKGROUND OF THE INVENTION

In the flat-panel display devices of the related arts, the color display screen displays an image by means of pixel units. In general, a pixel unit includes sub-pixels with three different colors of red (R), green (G) and blue (B), and the color and brightness displayed in a pixel point (wherein each pixel point corresponds to one pixel unit) are controlled by means of controlling magnitudes of components of three RGB sub-pixels in corresponding pixel unit.

FIGS. 1A to 1C are structural schematic diagrams of arrangements of the RGB sub-pixels in a pixel unit in the related art, including the following three types of arrangement: bar-shape arrangement (see FIG. 1A), delta arrangement (see FIG. 1B) and mosaic arrangement (see FIG. 1C). In FIG. 1A, the RGB sub-pixels are arranged in rows sequentially and the same type of RGB sub-pixels are arranged in a column respectively. Since there is only one color in the direction of column in such an arrangement, the color nonuniformity and the error of color edge are readily to occur, affecting the display effect. In the arrangements of FIG. 1B and FIG. 1C, the color nonuniformity in some directions also occurs and the resolution therein is not high.

In practice, the resolution of a display device can be improved by increasing Pixels Per Inch (PPI) of the display device. In order to increase PPI, it is needed to reduce the area of each pixel as much as possible and to reduce the distance between pixels. Correspondingly, since each pixel consists of sub-pixels, the number of needed sub-pixels is large when a display device requires a large amount of pixels to achieve the display with high resolution. However, the improvement to the process will reach the limits with consistent refinement of the process.

Above all, the following technical problems usually occur in the display devices of the related art:

1) The actual display resolution of a display device is the same as the physical resolution thereof. To obtain higher display resolution, it is needed to improve the physical resolution of the display device by increasing the number of sub-pixels. As described above, it is difficult to further increase the resolution when the number of sub-pixels increases up to a certain amount, due to the limit of the improvement to the process;

2) The fact that the number of sub-pixels in a display device is large results in large number of data lines, and thus increases the power consumption of the display device and reduces the aperture ratio of the display device (Generally, the aperture ratio in the art refers to the ratio of the area of light-emitting region in the pixel region and the area of the repeatable pixel unit in the display region. The larger the aperture ratio is, the lower the required brightness of each pixel light-emitting region is and the lower the current density of the brightness of the light-emitting region is so as to achieve the same display brightness). When the resolution is high, it is hard to ensure the aperture ratio of sub-pixel, which may influence on the characteristics of the products, such as lifetime, brightness and the like, consequently.

3) The number of sub-pixels in the display device is large, and the area of each sub-pixel is small, which thus causes the manufacture process of the display device to have great difficulties and high cost. Take the organic light emission display (referred to as OLED) for example, in the related art of manufacturing top-emitting active matrix organic light emission diode (AMOLED), since the fine metal mask (referred to as FMM) usually has limitation to the minimum opening when used for evaporating the pixels arranged in parallel, the sub-pixels with different colors have limitations to the distance between the openings. Thereby, the manufacture process of the display device is inevitably limited to the area of openings of the fine metal mask and the precision of evaporation process, which causes the difficulty in implementing the display device with high resolution.

It can be seen that, how to implement the manufacture process for high-resolution pixels, to increase the aperture ratio of sub-pixels, to obtain good brightness level and to extend the lifetime in the meantime was always the urgent technical problems to be solved in the art.

SUMMARY OF THE INVENTION

In view of the above defects in the related art, an object of the present invention is to provide a pixel structure and a display method thereof, and a display device, the pixel structure capable of increasing the aperture ratios of sub-pixels while achieving high resolution, which not only simplifies the manufacture process, obtains good brightness level and extends the lifetime of product, but also prevents the error of color edge and the color nonuniformity by setting the weighted value of the missing basic color of the pixel structure in the display process, hence achieving better display effect.

The technical solution used to solve the technical problem in the present invention is the pixel structure comprising first pixel units and second pixel units which are sequentially arranged in staggered positions, wherein the first pixel unit comprises a first sub-pixel and a second sub-pixel arranged in an oblique line, and the second pixel unit comprises a third sub-pixel and a fourth sub-pixel arranged in an oblique line, and wherein the first sub-pixel and the third sub-pixel have different basic colors and the second sub-pixel and the fourth sub-pixel have the same basic color.

Optionally, the first pixel units and the second pixel units are alternately arranged in a row direction and a column direction, and both the first pixel units in two adjacent rows and the second pixel units in two adjacent rows are arranged to stagger one pixel unit distance in the row direction, and both the first pixel units in two adjacent columns and the second pixel units in two adjacent columns are arranged to stagger one pixel unit distance in the column direction.

Optionally, the first sub-pixel and the second sub-pixel in the first pixel unit are disposed in adjacent two rows and adjacent two columns of sub-pixels, and the third sub-pixel and the fourth sub-pixel in the second pixel unit are disposed in adjacent two rows and adjacent two columns of sub-pixels, so that the first sub-pixels and the third sub-pixels are arranged alternately in turn in the row or column direction respectively, and the second sub-pixels and the fourth sub-pixels are arranged alternately in turn in the row or column direction, respectively.

Optionally, the first sub-pixels and the third sub-pixels are alternately disposed in odd rows and odd columns, and the second sub-pixels and the fourth sub-pixels are alternately disposed in even rows and even columns; or, the first sub-pixels and the third sub-pixels are alternately disposed in odd rows and even columns, and the second sub-pixels and the fourth sub-pixels are alternately disposed in even rows and odd columns; or, the first sub-pixels and the third sub-pixels are alternately disposed in even rows and odd columns, and the second sub-pixels and the fourth sub-pixels are alternately disposed in odd rows and even columns; or, the first sub-pixels and the third sub-pixels are alternately disposed in even rows and even columns, and the second sub-pixels and the fourth sub-pixels are alternately disposed in odd rows and odd columns.

Optionally, centers of the first sub-pixels and the third sub-pixels located in the same row or column are in the same line, and centers of the second sub-pixels and the fourth sub-pixels located in the same row or column are in the same line.

Optionally, the first sub-pixels, the second sub-pixels, the third sub-pixels and the fourth sub-pixels are arranged uniformly.

Optionally, in the same column, the center of the first sub-pixel is located in the perpendicular bisector of a line connecting the centers of two third sub-pixels adjacent to the first sub-pixel; and in the same row, the center of the first sub-pixel is located in the perpendicular bisector of a line connecting the centers of two third sub-pixels adjacent to the first sub-pixel.

Optionally, in the same column, the center of the third sub-pixel is located in the perpendicular bisector of a line connecting the centers of two first sub-pixels adjacent to the third sub-pixel; and in the same row, the center of the third sub-pixel is located in the perpendicular bisector of a line connecting the centers of two first sub-pixels adjacent to the third sub-pixel.

Optionally, the second sub-pixel or the fourth sub-pixel is located in a direction of an oblique angle of 45 degree with respect to the first sub-pixel or the third sub-pixel.

Optionally, area of the second sub-pixel is the same as that of the fourth sub-pixel, and area of the first sub-pixel is the same as that of the third sub-pixel and greater than that of the second sub-pixel; or, area of the second sub-pixel is the same as that of the fourth sub-pixel, area of the third sub-pixel is greater than that of the first sub-pixel, and area of the first sub-pixel is greater than that of the second sub-pixel.

Optionally, distance between the first sub-pixel and the second sub-pixel adjacent to each other is equal to distance between the third sub-pixel and the fourth sub-pixel adjacent to each other, and distance between the first sub-pixel and the third sub-pixel adjacent to each other is less than distance between the second sub-pixel and the fourth sub-pixel adjacent to each other.

Optionally, the basic colors include red, green and blue, the basic color of the first sub-pixel is red, the basic color of the third sub-pixel is blue, and the basic colors of the second and the fourth sub-pixels are green.

Optionally, each of the shapes of the first sub-pixel, the second sub-pixel, the third sub-pixel and the fourth sub-pixel is an axial-symmetric pattern with a symmetry axis extending in the direction in parallel to the row or column direction.

Optionally, the shapes of the first sub-pixel, the second sub-pixel, the third sub-pixel and the fourth sub-pixel are any one of round shape, triangular shape, quadrangular shape, pentagonal shape, hexagonal shape or octagonal shape or a combination thereof.

Optionally, the first sub-pixel and the third sub-pixel have quadrilateral or octagonal shape and the shapes of the first sub-pixel and the third sub-pixel are the same, and the second sub-pixel and the fourth sub-pixel have quadrilateral or octagonal shape and the shapes of the first sub-pixel and the third sub-pixel are the same.

Optionally, the first sub-pixel and the second sub-pixel in the first pixel unit are connected to one data line respectively, and the third sub-pixel and fourth sub-pixel in the second pixel unit are connected to one data line respectively, the data lines being used to receive the pixel display information.

A display method of the pixel structure according to the above description, wherein the first pixel unit additionally uses at least one of the third sub-pixels from adjacent second pixel units to display, and the second pixel unit additionally uses at least one of the first sub-pixels from adjacent first pixel units to display, so that both of the first pixel unit and the second pixel unit are capable of displaying the pixel display information for sub-pixels of three basic colors.

Optionally, the display method comprises the following steps:

Step S1: from the data source of pixel display information, obtaining theoretical brightness values of colors corresponding to the basic colors of the first sub-pixel and the second sub-pixel in the first pixel unit, and obtaining theoretical brightness values of colors corresponding to the basic colors of the third sub-pixel and the fourth sub-pixel in the second pixel unit;

Step S2: obtaining actual brightness values of the first sub-pixel, the second sub-pixel, the third sub-pixel and the fourth sub-pixel by calculation; and Step S3: inputting the actual brightness values into the first sub-pixel, the second sub-pixel, the third sub-pixel and the fourth sub-pixel to implement the image display.

Optionally, in Step S2, the actual brightness values of the second sub-pixel and the fourth sub-pixel are set to the theoretical brightness values of colors corresponding to their basic colors;

the actual brightness value of the first sub-pixel is set to a weighted sum of the theoretical brightness value of the basic color corresponding to the first sub-pixel needed in the first pixel unit and the theoretical brightness value of the basic color corresponding to the first sub-pixel needed in at least one of its adjacent second pixel units; and the actual brightness value of the third sub-pixel is set to a weighted sum of the theoretical brightness value of the basic color corresponding to the third sub-pixel needed in the second pixel unit and the theoretical brightness value of the basic color corresponding to the third sub-pixel needed in at least one of its adjacent first pixel units.

Optionally, the first pixel unit additionally uses N third sub-pixels from its adjacent second pixel units to display, and the second pixel unit additionally uses N first sub-pixels from its adjacent first pixel units to display; correspondingly, in Step S2, both of the weighted values of the theoretical brightness values of the first and the third sub-pixels are 1/N, wherein N≥1.

Optionally, the first pixel unit additionally uses one third sub-pixel from its adjacent second pixel unit to display, and the second pixel unit additionally uses one first sub-pixel in one adjacent first pixel unit to display; correspondingly, in Step S2, both of the weighted values of the theoretical brightness values of the first sub-pixel and the third sub-pixel are ½.

A display device comprises the above-described pixel structure.

Optionally, the display device is an organic light emission diode display device or liquid crystal display device.

The advantageous effects of the present invention are in that the pixel structure and the display method thereof provided in the present invention increases the aperture ratios of sub-pixels by improving the pixel arrangement, and increases the brightness of pixel structure and the pixel resolution correspondingly; in the meantime, a display method with respect to the above pixel structure is designed, which is capable of implementing normal image display and preventing the error of color edge and the color nonuniformity due to the pixel arrangements in the related art, thereby improving the display effect of display devices and solving the problems that the resolution of a display device, especially of an organic light emission display device, is hard to improve due to the process issue in the related art.

Figure 1A:
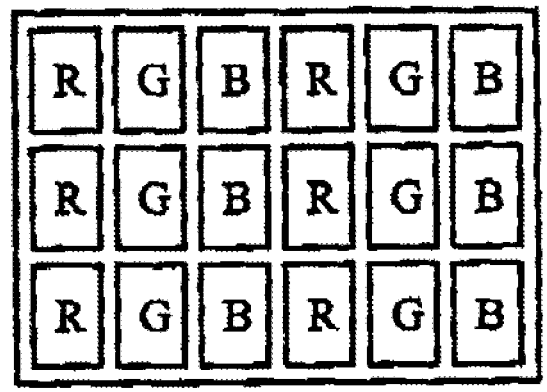
FIG. 1A is a structural schematic diagram of a bar-shape arrangement of RGB sub-pixels in the related art.
Figure 1B:
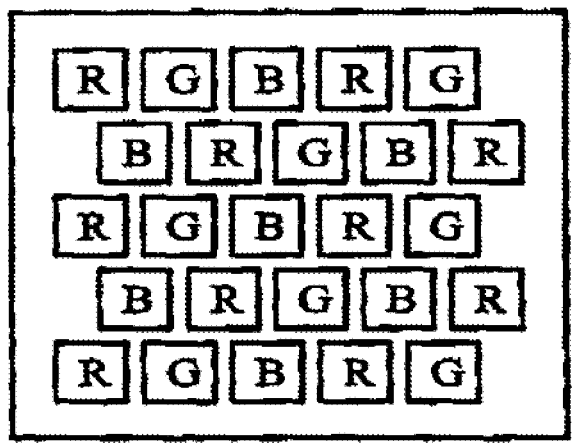
FIG. 1B is a structural schematic diagram of a delta arrangement of RGB sub-pixels in the related art.
Figure 1C:
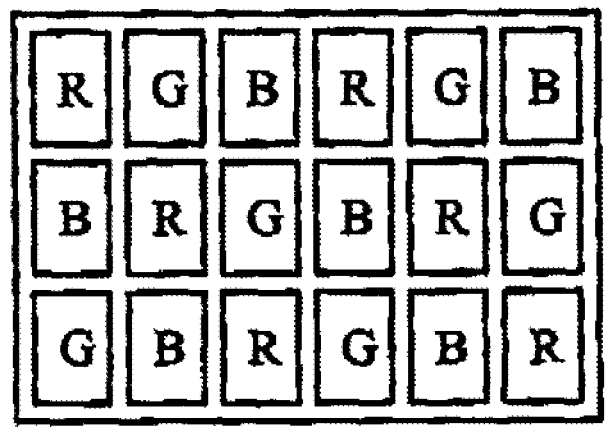
FIG. 1C is a structural schematic diagram of the mosaic arrangement of RGB sub-pixels in the related art.

In the reference numerals:
1—first pixel unit; 11—first sub-pixel; 12—second sub-pixel;
2—second pixel unit; 21—third sub-pixel; 22—fourth sub-pixel.

DETAILED DESCRIPTION OF THE EMBODIMENTS

To make those skilled in the art better understand the technical solutions of the present invention, a pixel structure and a display method thereof and a display device comprising the pixel structure of the present invention will be further described in detail below in conjunction with the accompanying drawings and detailed description of the embodiments.

The technical concept of the present invention is: forming a plurality of colors by using the mixture of three primary colors of red, green and blue so as to implement the image display; and disposing the three primary colors of red, green and blue, which are disposed in the same pixel unit in the related art, separately into adjacent two pixel units by using the characteristics that the sensitivity of human eyes to different colors varies, and adjusting the arrangement of pixel units such that the pixel unit in the pixel structure can implement the display of three primary colors of RGB by additionally using the missing basic colors of its own from adjacent pixel units, therefore implementing the image display with different colors and obtaining good color uniformity.

A pixel structure includes first pixel units and second pixel units arranged alternately in turn, wherein the first pixel unit comprises a first sub-pixel and a second sub-pixel arranged in an oblique line, and the second pixel unit comprises a third sub-pixel and a fourth sub-pixel arranged in an oblique line; and the first and the third sub-pixels have different basic colors and the second and the fourth sub-pixels have the same basic color.

Such pixel structure is capable of increasing the aperture ratio of sub-pixels while achieving high resolution, which not only simplifies the manufacture process, obtains good brightness level and extends the lifetime of the product, but also prevents the error of color edge and the color nonuniformity by setting the weighted value of the missing basic color of the pixel structure in the display process, hence achieving better display effect.

First Embodiment

Figure 2A:
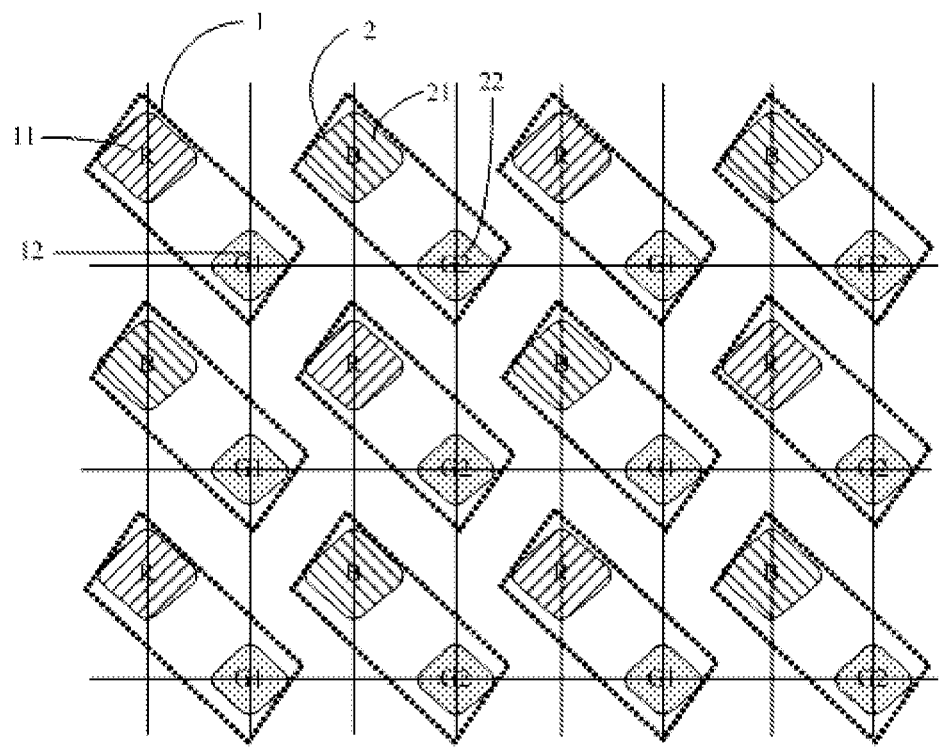
FIG. 2A is a structural schematic diagram of one of arrangements of pixel units in the pixel structure according to a first embodiment of the present invention.
Figure 2B:
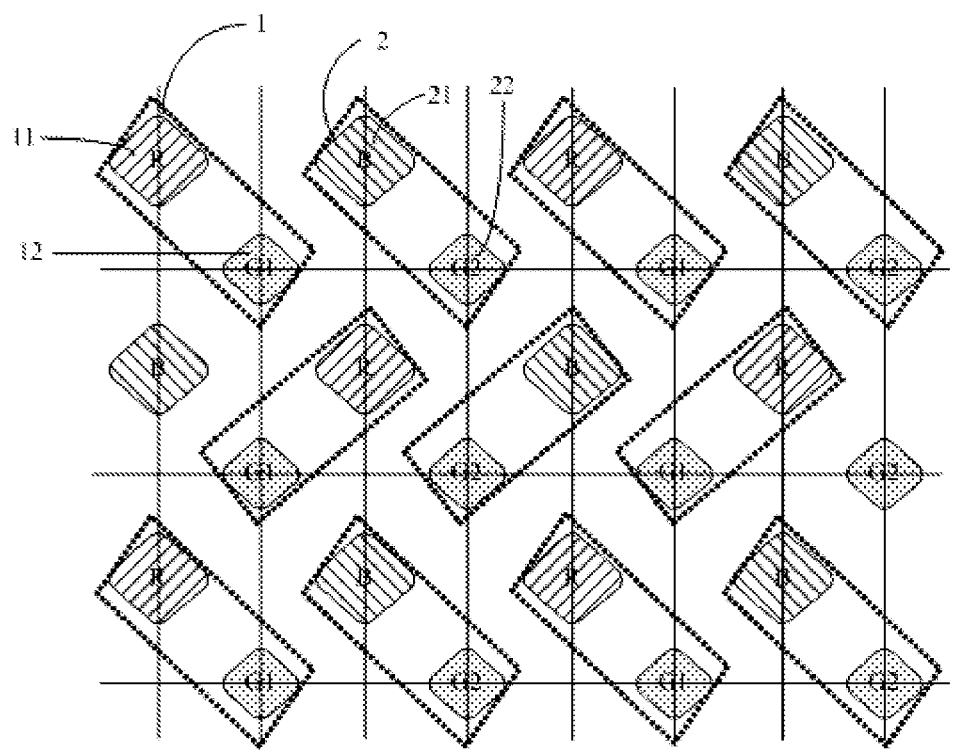
FIG. 2B is a structural schematic diagram of another one of arrangements of pixel units in the pixel structure according to the first embodiment of the present invention.

As shown in FIGS. 2A and 2B, this embodiment provides a pixel structure, including first pixel units 1 and second pixel units 2 which are arranged alternately in turn, wherein the first pixel unit 1 comprises a first sub-pixel 11 and a second sub-pixel 12 arranged in an oblique line, and the second pixel unit 2 comprises a third sub-pixel 21 and a fourth sub-pixel 22 arranged in an oblique line; and the first sub-pixel 11 and the third sub-pixel 21 have different basic colors, and the second sub-pixel 12 and the fourth sub-pixel 22 have the same basic color.

In this embodiment, the basic color of the first sub-pixel 11 is red, the basic color of the third sub-pixel 21 is blue, and the basic color of the second sub-pixel 12 and the fourth sub-pixel 22 is green. The basic color refers to color owned by the sub-pixel structure and capable of implementing the color display. For example, with respect to the pixel structure in the organic light emitting display device, the basic color refers to the color of the light-emitting layer in the organic light emitting diode, that is, the color corresponding to the light emitted from the light-emitting layer under normal voltage; with respect to the pixel structure in the liquid crystal display device, the basic color refers to color of a color filter (referred to as CF) in a color filter substrate, that is, the color corresponding to the light of the backlight source which is filtered by the color filter substrate. Generally, the basic colors include red, green and blue. In this embodiment, the basic color of sub-pixel may be selected any one from the three primary colors of red, green and blue.

The alternating arrangements of the first and the second pixel units are shown in FIGS. 2A and 2B, in which the directions of the oblique arrangements of the sub-pixels in the first pixel unit 1 and the second pixel unit 2 adjacent to each other in each column may parallel to each other (as shown in FIG. 2A), or may cross each other and even may be perpendicular to each other (as shown in FIG. 2B).

In above-described pixel structure, the first pixel units 1 and the second pixel units 2 are alternately arranged in the row and column directions. Specifically, the first pixel units 1 and the second pixel units 2 are alternately arranged in the row and column directions. Among the pixel units in adjacent rows, the first pixel unit 1 and the second pixel unit 2 are arranged to stagger one pixel unit distance in the row direction. Among the pixel units in adjacent columns, the first pixel unit 1 and the second pixel unit 2 are arranged to stagger one pixel unit distance in the column direction. The pixel unit include the first pixel unit 1 or the second pixel unit 2.

Based on the above-described structure with alternating arrangement, the first pixel units 1 and the second pixel units 2 are arranged in a different order in adjacent rows of pixel units as well as in adjacent columns of pixel units. As shown in FIGS. 2A and 2B, each pixel unit is illustrated in the dash-line frame. Among two adjacent rows of the pixel units, if the first pixel units 1 and the second pixel units 2 in one row are arranged in the order of the first pixel unit 1, the second pixel unit 2, the first pixel unit 1, the second pixel unit 2, . . . , the first pixel units 1 and the second pixel units 2 in the other row are arranged in the order of the second pixel unit 2, the first pixel unit 1, the second pixel unit 2, the first pixel unit 1, . . . . Among two adjacent columns of the pixel units, if the first pixel units 1 and the second pixel units 2 in one column are arranged in the order of the first pixel unit 1, the second pixel unit 2, the first pixel unit 1, the second pixel unit 2, . . . , the first pixel units 1 and the second pixel units 2 in the other column are arranged in the order of the second pixel unit 2, the first pixel unit 1, the second pixel unit 2, the first pixel unit 1, . . . .

With respect to the order of arranging the sub-pixels in each pixel unit, as shown in FIGS. 2A and 2B, the first sub-pixel 11 and the second sub-pixel 12 in the first pixel unit 1 are disposed in adjacent two rows of sub-pixels and adjacent two columns of sub-pixels respectively, and the third sub-pixel 21 and the fourth sub-pixel 22 in the second pixel unit 2 are disposed in adjacent two rows of sub-pixels and adjacent two columns of sub-pixels respectively, so that the first sub-pixels 11 and the third sub-pixels 21 are arranged alternately in turn in the row or column direction respectively, and the second sub-pixels 12 and the fourth sub-pixels 22 are arranged alternately in turn in the row or column direction respectively, that is, the second sub-pixels 12 and the fourth sub-pixels 22 are arranged in the same row or column.

In specific arrangement, if the first sub-pixels 11 and the third sub-pixels 21 are alternately disposed in odd rows or even rows, the second sub-pixels 12 and the fourth sub-pixels 22 are alternately disposed in even rows or odd rows accordingly. Likewise, if the first sub-pixels 11 and the third sub-pixels 21 are alternately disposed in odd columns or even columns, the second sub-pixels 12 and the fourth sub-pixels 22 are alternately disposed in even columns or odd columns accordingly. The following arrangement structures are included specifically: the first sub-pixels 11 and the third sub-pixels 21 are alternately disposed in odd rows and odd columns, and the second sub-pixels 12 and the fourth sub-pixels 22 are alternately disposed in even rows and even columns; or, the first sub-pixels 11 and the third sub-pixels 21 are alternately disposed in odd rows and even columns, and the second sub-pixels 12 and the fourth sub-pixels 22 are alternately disposed in even rows and odd columns; or, the first sub-pixels 11 and the third sub-pixels 21 are alternately disposed in even rows and odd columns, and the second sub-pixels 12 and the fourth sub-pixels 22 are alternately disposed in odd rows and even columns; or, the first sub-pixels 11 and the third sub-pixels 21 are alternately disposed in even rows and even columns, and the second sub-pixels 12 and the fourth sub-pixels 22 are alternately disposed in odd rows and odd columns. It should be noted that, in the case that the first sub-pixels 11 and the third sub-pixels 21 are alternately disposed in odd rows and even columns, and the second sub-pixels 12 and the fourth sub-pixels 22 are alternately disposed in even rows and odd columns, or the first sub-pixels 11 and the third sub-pixels 21 are alternately disposed in even rows and odd columns, and the second sub-pixels 12 and the fourth sub-pixels 22 are alternately disposed in odd rows and even columns, since one single row or column of sub-pixels may occur at the edge, each of such sub-pixels may be combined with adjacent a first pixel unit 1 or a second pixel unit 2 to form a pixel unit comprising three sub-pixels for display, or may display by additionally using two sub-pixels from adjacent first pixel unit 1 or second pixel unit 2, which can implement excellent display effect by using the edge processing algorithms, which is not limited herein.

As shown in FIGS. 2A and 2B, among two adjacent rows of sub-pixels, the first sub-pixels 11 and the third sub-pixels 21 are alternately disposed in one row, and the second sub-pixels 12 and the fourth sub-pixels 22 are alternately disposed in the other row. Correspondingly, among two adjacent columns of sub-pixels, the first sub-pixels 11 and the third sub-pixels 21 are alternately disposed in one column, and the second sub-pixels 12 and the fourth sub-pixels 22 are alternately disposed in the other column. In practice, it is flexible to dispose the sub-pixels depending on the aspect ratio of the display panel and the actual length and width thereof.

Figure 3:
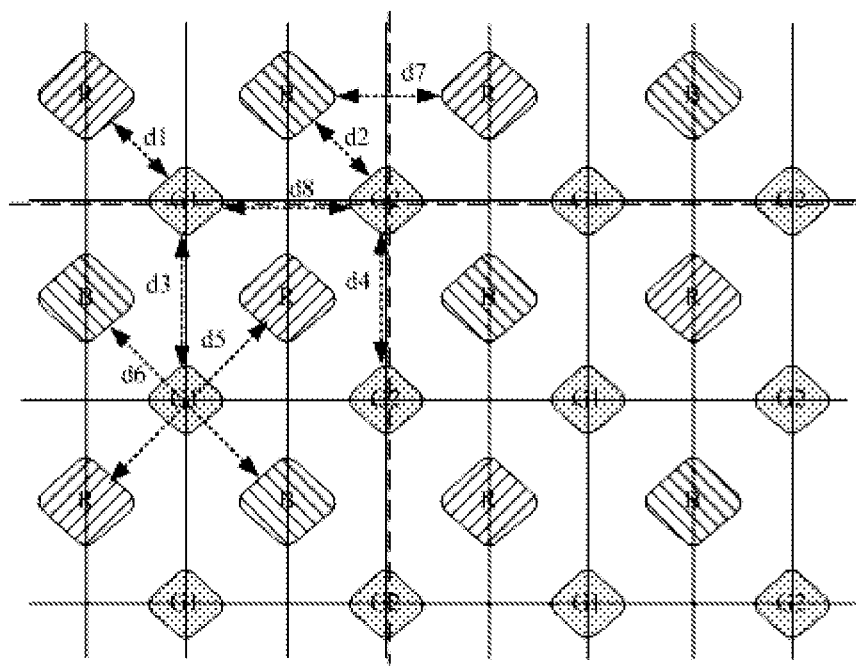
FIG. 3 is a structural schematic diagram of a relationship between positions of the sub-pixels in the pixel units of FIG. 2A.

Take the pixel structure in FIG. 2A for example, as illustrated with the dash lines in FIG. 3 (wherein, the first sub-pixels 11, the second sub-pixels 12, the third sub-pixels 21 and the fourth sub-pixels 22 all are the same as those in FIG. 2A and not marked in detail herein), centers of the first sub-pixels 11 and the third sub-pixels 21 located in the same row or column are in the same line, and centers of the second sub-pixels 12 and the fourth sub-pixels 22 located in the same row or column are in the same line, so as to simplify the manufacture process of the pixel structure.

The first sub-pixels 11, the second sub-pixels 12, the third sub-pixels 21 and the fourth sub-pixels 22 are arranged uniformly to ensure the uniformity of the display effect. The sub-pixels with respective colors of red, green and blue in the entire display panel can be distributed uniformly based on such disposition, and thus the image display with higher quality can be implemented.

Correspondingly, as shown in FIG. 3, in the same column, the center of the first sub-pixel 11 is located in the perpendicular bisector of a line connecting the centers of two third sub-pixels 21 adjacent to the first sub-pixel 11, meanwhile, in the same row, the center of the first sub-pixel 11 is located in the perpendicular bisector of the line connecting the centers of two third sub-pixels 21 adjacent to the first sub-pixel 11. Likewise, in the same column, the center of the third sub-pixel 21 is located in the perpendicular bisector of a line connecting the centers of two first sub-pixels 11 adjacent to the third sub-pixel 21, meanwhile, in the same row, the center of the third sub-pixel 21 is located in the perpendicular bisector of a line connecting the centers of two first sub-pixels 11 adjacent to the third sub-pixel 21.

In addition, as shown in FIG. 3, the second sub-pixel 12 or the fourth sub-pixel 22 is located in a direction of an oblique angle of 45 degree with respect to the first sub-pixel 11 or the third sub-pixel 21. That is, in two adjacent pixel units, the second sub-pixel 12 are located in the direction of an oblique angle of 45 degree with respect to the first sub-pixel 11 or the third sub-pixel 21 respectively, for example, the upper left direction of 45 degree, the upper right direction of 45 degree, the bottom left direction of 45 degree or the bottom right direction of 45 degree. FIG. 2A shows the case that the second sub-pixel 12 is located in the bottom right direction of 45 degree with respect the first sub-pixel 11.

In this embodiment, the first sub-pixel 11 is a red sub-pixel, the second sub-pixel 12 is a green sub-pixel, the third sub-pixel 21 is a blue sub-pixel, and the fourth sub-pixel 22 is a green sub-pixel. With respect to setting areas of respective sub-pixels, one preferable method is that the area of the second sub-pixel 12 is the same as that of the fourth sub-pixel 22, and the area of the first sub-pixel 11 is the same as that of the third sub-pixel 21 and greater than that of the second sub-pixel 12. In this embodiment, since the human eyes are more sensitive to green, the areas of the second sub-pixel 12 and the fourth sub-pixel 22 may be set to smaller than those of the first sub-pixel 11 and the third sub-pixel 21.

Another preferable method is that the area of the third sub-pixel 21 is greater than that of the first sub-pixel 11, and the area of the first sub-pixel 11 is greater than that of the second sub-pixel 12. Particularly, with respect to the display devices of organic light emitting diodes, since materials emitting blue light generally have the lowest luminous efficiency and the shortest lifetime compared with those emitting red and green light, the area of blue sub-pixel may be greater than that of red sub-pixel and green sub-pixel. Furthermore, materials emitting green light have the highest luminous efficiency so that the area of green sub-pixel may be minimal.

In this embodiment, the pixel structure may be of RGBG or GRGB or BRGR, which thus makes the color of the image displayed on the display panel more vivid.

In this embodiment, distance between the first sub-pixel 11 and the second sub-pixel 12 adjacent to each other is equal to distance between the third sub-pixel 21 and the fourth sub-pixel 22 adjacent to each other, and distance between the first sub-pixel 11 and the third sub-pixel 21 adjacent to each other is less than distance between the second sub-pixel 12 and the fourth sub-pixel 22 adjacent to each other.

As shown in FIG. 3, in the case that the distance between two adjacent sub-pixels is defined as the length of a line connecting two closest points of the sub-pixels, the distance d1 between the first sub-pixel 11 and the second sub-pixel 12 is equal to the distance d2 between the third sub-pixel 21 and the fourth sub-pixel 22. Further, for the sub-pixels which are located on the edge of the display screen and not capable of constituting complete pixel units, for example, for three sub-pixels just having three primary colors, the distance d7 between the first sub-pixel 11 and the third sub-pixel 21 may also be equal to the distance d1 between the first sub-pixel 11 and the second sub-pixel 12 to simplify the manufacture process of the pixel structure.

In addition, the distance d3 between two adjacent second sub-pixels 12 is equal to the distance d4 between two adjacent fourth sub-pixels 22, and less than the distance d5 between two adjacent first sub-pixels 11 and the distance d6 between two adjacent third sub-pixels 21; and the distance d7 between the first sub-pixel 11 and the third sub-pixel 21 adjacent to each other is less than the distance d8 between the second sub-pixel 12 and the fourth sub-pixel 22 adjacent to each other.

It should be understood that the distance between sub-pixels may be flexibly set as desired to ensure the precision of the display screen formed by a plurality of sub-pixels.

In this embodiment, the shapes of the first sub-pixel 11, the second sub-pixel 12, the third sub-pixel 21 and the fourth sub-pixel 22 are axial-symmetric patterns with symmetry axis extending in the direction in parallel to the row or column direction respectively, which thus makes each pixel unit in the pixel structure to be formed as a structure arranged along the symmetry axis of the pattern of sub-pixels. For example, in the case of forming the pixel structure with a fine metal mask FMM, the FMM is generally stretched towards the row or column direction during the process. Since the symmetry axis of the pixel pattern is arranged in the row or column direction, no transformation of the sub-pixel patterns due to the stretching process of FMM occurs, which thus ensures correct positions of the sub-pixels in the pixel structure.

Specifically, the shapes of the first sub-pixel 11, the second sub-pixel 12, the third sub-pixel 21 and the fourth sub-pixel 22 may be any one of round shape, triangular shape, quadrangular shape, pentagonal shape, hexagonal shape or octagonal shape or combination thereof. For example, The first sub-pixel 11, the second sub-pixel 12, the third sub-pixel 21 and the fourth sub-pixel 22 may all have quadrangular shape or octagonal shape, or the first sub-pixel 11 and the third sub-pixel 21 may have octagonal shape and the second sub-pixel 12 and the fourth sub-pixel 22 may have quadrangular shape, and the like, which may be selected according to the requirement of actual design. As a particular example, the above sub-pixels all have diamond shape or square shape, and the diagonal thereof may be selected as the symmetry axis of the sub-pixel patterns, along which the first sub-pixel 11, the second sub-pixel 12, the third sub-pixel 21 and the fourth sub-pixel 22 are arranged.

In practice, it may be flexible to dispose the sub-pixels depending on the application occasion of display panel or the display effect required by customers. For example, the respective sub-pixels may be designed to quadrangular shape as shown in FIG. 2A or 2B, and with the consideration of wiring of the panel and the manufacture process of the mask, the respective sub-pixels may be designed to octagonal shape, for example, which is formed by cutting four corners of the quadrangular-shaped sub-pixel in FIG. 2A or 2B. The respective sub-pixels may also be designed to other shape such as hexagonal shape, round shape, triangular shape, pentagonal shape and the like without doubt.

Optionally, the first sub-pixel 11 and the third sub-pixel 21 have quadrilateral or octagonal shape and the shapes of the first sub-pixel 11 and the third sub-pixel 21 are the same, and the second sub-pixel 12 and the fourth sub-pixel 22 have quadrilateral or octagonal shape and the shapes of the second sub-pixel 12 and the fourth sub-pixel 22 are the same, so as to facilitate the manufacture of the masks.

On the basis of the above, the first pixel unit 1 and the second pixel unit 2 include an organic light emitting diode display device or a liquid crystal display device, that is, the pixel structure of this embodiment is suitable not only for the organic light emitting diode display devices, but also for the LCD display devices, and may also be suitable for other devices having a pixel structure, such as a digital camera, a plasma display device and the like.

The first sub-pixel 11, the second sub-pixel 12, the third sub-pixel 21 and the fourth sub-pixel 22 are formed by using patterning process. For the above-described structure in which the areas of the first sub-pixel 11 and the third sub-pixel 21 are the same and are greater than that of the second sub-pixel 12, the first sub-pixel 11 and the third sub-pixel 21 are formed by using the same mask through two patterning processes, and the second sub-pixel 12 and the fourth sub-pixel 22 are formed by using the same mask through a single patterning process. When the area of the first sub-pixel 11 is set to the same as that of the third sub-pixel 21, the same mask may be shared by the manufacture of red sub-pixels and that of blue sub-pixels. Thus it is only needed to move the mask by a distance between two adjacent sub-pixels in the row or column in the row or column direction.

Here, the patterning process may include a photolithography process only, or may include the photolithography process and a etching process, and may also include other processes for forming a predetermined pattern, such as printing, inkjet and the like. The photolithography process refers to a process for forming patterns using photoresist, mask, exposure machine and the like, including film formation process, exposure process, development process and the like. Corresponding patterning process may be selected depending on the structure formed in the present invention.

Figure 4A:
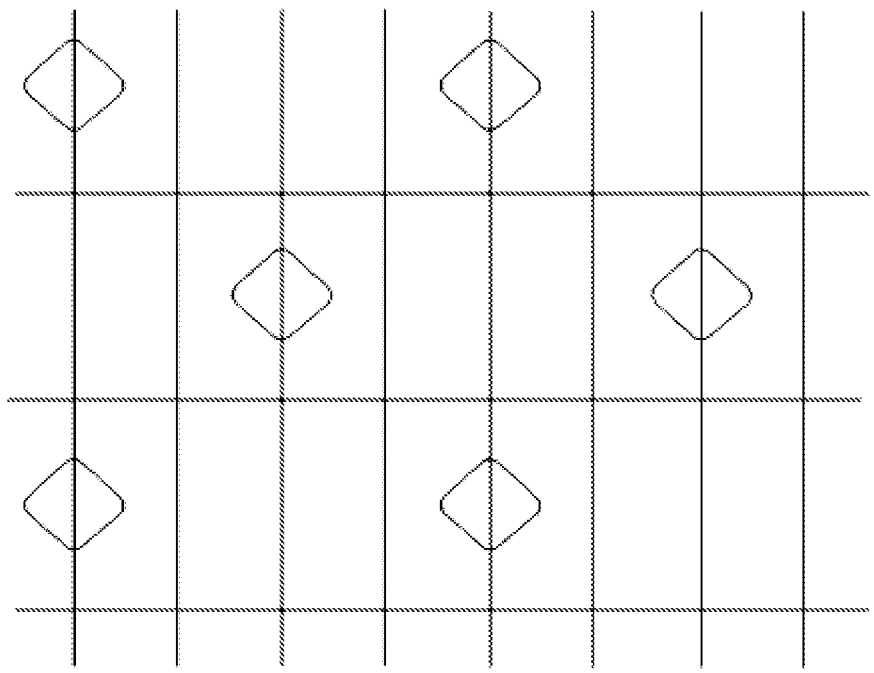
FIG. 4A is a structural schematic diagram of a mask shared in the formation of first sub-pixel and third sub-pixel.
Figure 4B:
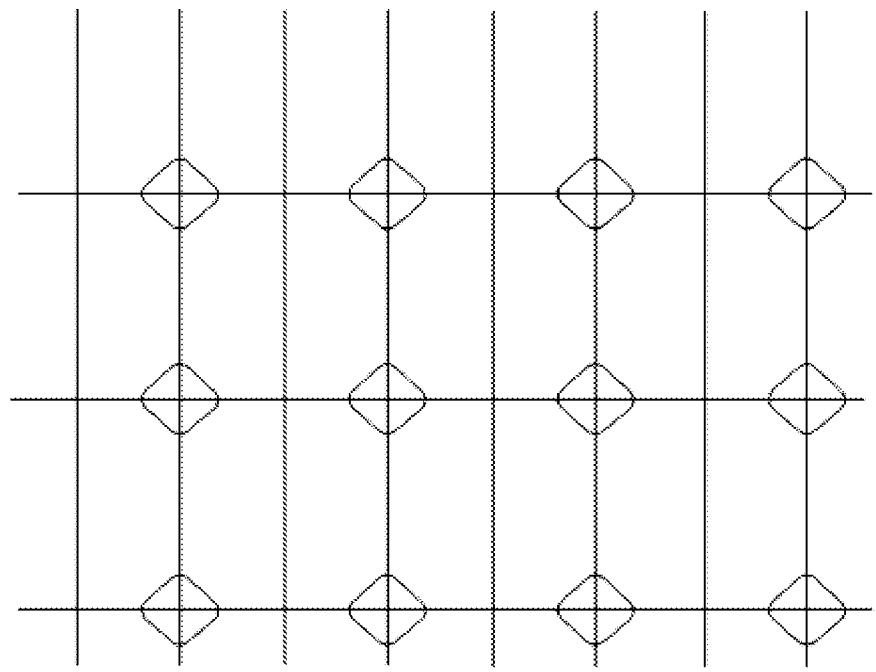
FIG. 4B is a structural schematic diagram of a mask shared in the formation of second sub-pixel and fourth sub-pixel.

At this time, the opening width of the mask used for the green sub-pixels is increased as compared to that of the FMM used in the conventional bar-shape arrangement. When manufacturing the organic light emitting diode display devices, since the orientation of the distance between pixels is transferred from the row or column direction to the diagonal direction, the distance between sub-pixels is increased, which is beneficial to the mask process. As shown in FIG. 4A, the pattern region is set to the opening regions of the mask for manufacturing red sub-pixels, the opening width of the opening region is much larger than that of the FMM used in the conventional bar-shape arrangement. As shown in FIG. 4B, the pattern region is set to the opening regions of the mask for manufacturing green sub-pixels, the opening width of the opening region is much larger than that of the FMM used in the conventional bar-shape arrangement. It should be understood that the criss-cross lateral and vertical lines disposed in FIGS. 4A and 4B are for the ease of observing the location and the width of the opening regions corresponding to respective sub-pixels and are absent in the actual mask.

It can be seen that the opening widths of the mask for red sub-pixels, blue sub-pixels or green sub-pixels are all increased, which thus is favorable for the design of FMM and the evaporation process for organic layer and makes it easier to implement high resolution. It can also be seen that, compared to the pixel structure of one pixel unit consisting of three sub-pixels in the prior art, the pixel structure in the present embodiment can simplify manufacture process largely, thus the FMM process can be implemented more easier.

Meanwhile, in the pixel structure of the present embodiment, each pixel unit only consists of two sub-pixels, and each sub-pixel is connected to one data line receiving pixel information (the same as that in the related art). That is, the first sub-pixel 11 and the second sub-pixel 12 in the first pixel unit 1 are connected to two data lines (not shown in FIGS. 2A and 2B), respectively, and the third sub-pixel 21 and fourth sub-pixel 22 in the second pixel unit 2 are connected to two data lines respectively. Therefore, in the case of having the same number of pixel units, the data lines in this embodiment are less than that in the related art, so that the power consumption of the display device is reduced and the aperture ratio of the display device is increased, which improves the brightness of the pixel structure in the display device accordingly.

Second Embodiment

This embodiment provides a display method of the pixel structure in the first embodiment. In the pixel structure, one pixel unit consists of two sub-pixels and the pixel display with higher resolution may be implemented in conjunction with pixel-sharing algorithm.

In this embodiment, the first pixel unit 1 additionally uses at least one of the third sub-pixels 21 from adjacent second pixel units 2 to display, and the second pixel unit 2 additionally uses at least one of the first sub-pixels 11 from adjacent first pixel units 1 to display, so that both of the first pixel unit 1 and the second pixel unit 2 can display the pixel display information for sub-pixels of three basic colors.

Figure 5:
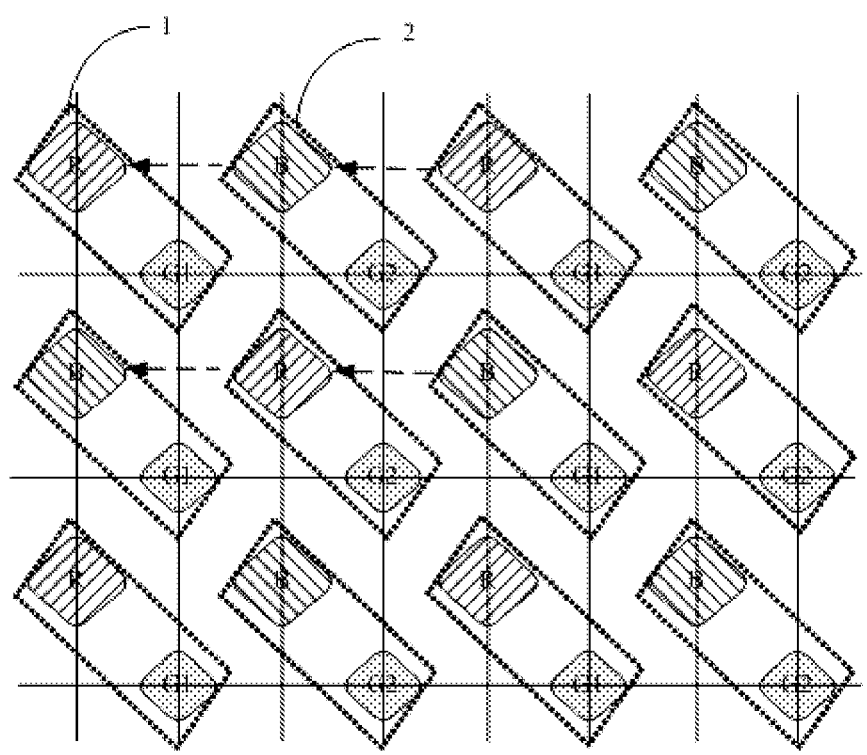
FIG. 5 is a diagram of implementing the display of three primary colors of RGB by a first pixel unit and a second pixel unit of the pixel structure in the second embodiment by means of adjacent sub-pixels of missing basic colors.

In the display, the first pixel unit 1 having a red sub-pixel and a green sub-pixel additionally uses the blue sub-pixel in an adjacent second pixel unit 2 to implement the display of three primary colors of RGB. Similarly, the second pixel unit 2 having a blue sub-pixel and a green sub-pixel additionally uses the red sub-pixel in an adjacent first pixel unit 1 to implement the display of three primary colors of RGB. The detailed principle of additionally using is that, as shown in FIG. 5, each pixel unit may additionally uses the sub-pixel of its missing color from its adjacent pixel unit on its either side, for example, additionally uses the sub-pixel from its adjacent pixel unit on its right side or left side, or additionally uses the sub-pixel from its adjacent pixel unit on its upper side or bottom side; and a plurality of sub-pixels may be additionally used, and only one sub-pixel may also be additionally used, both of which are not limited herein.

In the process of image display, a data source of pixel display information is provided first to input pixel data including RGB color information into each of the first pixel units 1 and the second pixel units 2, the display method of the pixel structure comprising the following steps:

Step S1: obtaining the theoretical brightness values of colors corresponding to the basic colors of the first sub-pixel 11 and the second sub-pixel 12 in the first pixel unit 1 from the data source of pixel display information, and obtaining the theoretical brightness values of colors corresponding to the basic colors of the third sub-pixel 21 and the fourth sub-pixel 22 in the second pixel unit 2.

In this step, according to operation principle of the display panel driving chip, the pixel data is color-separated, amplified and corrected to obtain three primary colors, and then is matrix-transformed to obtain a brightness signal, which is the theoretical brightness values of colors corresponding to three primary colors. The process of this part may use any processing method of brightness separation in the related art, thus not described in detail herein.

Step S2: obtaining the actual brightness values of the first sub-pixel 11, the second sub-pixel 12, the third sub-pixel 21 and the fourth sub-pixel 22 by calculation.

In brief, take the calculation of the brightness value of red sub-pixel for example, the actual brightness value of the first sub-pixel 11 in the first pixel unit 1 is obtained by weighting the theoretical brightness value of red color needed to be displayed in the pixel unit and the theoretical brightness value of red color needed to be displayed in at least one of the second pixel units 2 in its adjacent rows or columns. The calculation method of the actual brightness value of the third sub-pixel 21 in the second pixel unit 2 is similar.

Specifically, in this step, the actual brightness values of the second sub-pixel 12 and the fourth sub-pixel 22 are set to the theoretical brightness values of colors corresponding to their basic colors.

The actual brightness value of the first sub-pixel 11 is set to a weighted sum of the theoretical brightness value of the basic color corresponding to the first sub-pixel 11 needed in the first pixel unit 1 and that of the basic color corresponding to the first sub-pixel 11 needed in at least one of its adjacent second pixel units 2.

The actual brightness value of the third sub-pixel 21 is set to a weighted sum of the theoretical brightness value of the basic color corresponding to the third sub-pixel 21 needed in the second pixel unit 2 and that of the basic color corresponding to the third sub-pixel 21 needed in at least one of its adjacent first pixel units 1.

For example, the first pixel unit 1 additionally uses the third sub-pixels 21 in its N adjacent second pixel units 2 to display the sub-pixel of the basic color missing in the said first pixel unit 1, and the second pixel unit 2 additionally uses the first sub-pixels 11 in its N adjacent first pixel units 1 to display the sub-pixel of the basic color missing in the said second pixel unit 2, thereby implementing the display of three primary colors of RGB. Correspondingly, in this step, both of the weighted values of the theoretical brightness values of the first sub-pixel 11 and the third sub pixel 21 are 1/N, wherein N≥1. It should be understood that the weighted value may be adjusted properly according to the overall picture effect of image corresponding to the pixel data to obtain appropriate weighted sums.

One preferable simple method is that the first pixel unit 1 additionally uses the third sub-pixel 21 in one adjacent second pixel unit 2 to display, and the second pixel unit 2 additionally uses the first sub-pixel 11 in one adjacent first pixel unit 1 to display. Correspondingly, in this step, both of the weighted values of the theoretical brightness values of the first sub-pixel 11 and the third sub-pixel 21 are ½.

In this embodiment, the final actual brightness value of the actual sub-pixel is the sum of the products by multiplying the theoretical brightness value of the basic color of the actual sub-pixel in pixel unit, in which the actual sub-pixel is located, and the theoretical brightness values of the sub-pixels, additionally used by the actual sub-pixel, having the same basic color in its adjacent pixel units by their weighted values respectively. For example, when one pixel unit additionally uses two adjacent pixel units, the above relationship between the weighted value and the weighted sum is H=Ax+By+Cz, wherein A, B and C are weighted values of the sub-pixels having the same basic color in above-described three pixel units respectively, and the weighted values satisfy the following relationship A+B+C=1, wherein H is the actual brightness value of the sub-pixel having the basic color, i.e. the weighted sum.

Take the case that each pixel unit may additionally use the sub-pixel having its missing basic color in the adjacent pixel unit on its right side for example, since each red sub-pixel and each blue sub-pixel are used in the display of two pixel units, the input data signal of the sub-pixels are the weighted sum of two sub-pixel signals, for example, for a blue sub-pixel, its input signal is the sum of the signal of the blue sub-pixel in its own pixel unit and the signal of the blue sub-pixel needed for normal display in an adjacent second pixel unit 2, both of which may take the half portion respectively, for example.

Step S3: inputting the actual brightness values into the first sub-pixel 11, the second sub-pixel 12, the third sub-pixel 21 and the fourth sub-pixel 22 to implement the display of three primary colors of RGB, thereby implementing the image display.

In this step, the actual brightness values of the respective sub-pixels obtained in the step S2 are input into the first sub-pixel 11, the second sub-pixel 12, the third sub-pixel 21 and the fourth sub-pixel 22 to implement the image display.

As exemplified in the pixel structure of the first embodiment, each sub-pixel is connected to one data line, and in this step, the actual brightness values of respective sub-pixels obtained in Step S2 are output through the data lines connected with the first sub-pixel 11, the second sub-pixel 12, the third sub-pixel 21 and the fourth sub-pixel 22 respectively. It could be understood that, on the basis of the actual brightness values of respective sub-pixels obtained in Step S2, the theoretical brightness values corresponding to three basic colors in one pixel unit may be converted into the actual brightness values corresponding to two sub-pixels in one pixel unit by a process unit or data conversion module, and connected to one pixel unit through two data lines, and detailed process of data conversion is omitted herein.

This display method of pixel structure implements the display of three primary colors for the pixel units having two sub-pixels by using the pixel units comprising only two sub-pixels and simple pixel-sharing algorithm.

Third Embodiment

This embodiment provides a display device which uses the pixel structure in the first embodiment and the display method of pixel structure in the second embodiment.

The display device may be any product or component with the function of display, such as liquid crystal panels, electronic paper, OLED panels, mobile phones, tablet computers, televisions, displays, notebook computers, digital picture frames, navigators and the like.

The display device shows high yield since the pixel structure thereof is significantly beneficial to the evaporation process for organic layer. Furthermore, the display device shows good display effect for the reason that the pixel structure thereof achieves higher brightness and color uniformity.

The pixel structure and the display method thereof increases the aperture ratio by improving the pixel arrangement, and correspondingly increases the brightness of pixel structure and the pixel resolution; in the meantime, a display method with respect to the above pixel structure is designed, which is capable of implementing normal image display and preventing the error of color edge and the color nonuniformity due to the pixel arrangements in the related art, thereby improving the display effect of display devices and solving the problems that the resolution of display device, especially of organic light emitting display device, is hard to improve due to the process issue in the related art.

It should be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

The invention claimed is:

1. A pixel structure, comprising first pixel units and second pixel units which are sequentially arranged in staggered positions, wherein the first pixel unit comprises a first sub-pixel and a second sub-pixel arranged in an oblique line, and the second pixel unit comprises a third sub-pixel and a fourth sub-pixel arranged in an oblique line, wherein the first sub-pixel and the third sub-pixel have different basic colors, and the second sub-pixel and the fourth sub-pixel have the same basic color, and wherein the first pixel unit additionally uses at least one of the third sub-pixels from adjacent second pixel units to display, and the second pixel unit additionally uses at least one of the first sub-pixels from adjacent first pixel units to display, so that both of the first pixel unit and the second pixel unit are capable of displaying the pixel display information for sub-pixels of three basic colors.

2. The pixel structure according to claim 1, wherein the first pixel units and the second pixel units are alternately arranged in a row direction and a column direction, and both the first pixel units in two adjacent rows and the second pixel units in two adjacent rows are arranged to stagger one pixel unit distance in the row direction, and both the first pixel units in two adjacent columns and the second pixel units in two adjacent columns are arranged to stagger one pixel unit distance in the column direction.

3. The pixel structure according to claim 2, wherein the first sub-pixels and the second sub-pixels in the first pixel units are disposed in adjacent two rows and adjacent two columns of sub-pixels, and the third sub-pixels and the fourth sub-pixels in the second pixel units are disposed in adjacent two rows and adjacent two columns of sub-pixels, so that the first sub-pixels and the third sub-pixels are arranged alternately in turn in the row or column direction respectively, and the second sub-pixels and the fourth sub-pixels are arranged alternately in turn in the row or column direction, respectively.

4. The pixel structure according to claim 3, wherein
the first sub-pixels and the third sub-pixels are alternately disposed in odd rows and odd columns, and the second sub-pixels and the fourth sub-pixels are alternately disposed in even rows and even columns; or,
the first sub-pixels and the third sub-pixels are alternately disposed in odd rows and even columns, and the second sub-pixels and the fourth sub-pixels are alternately disposed in even rows and odd columns; or,
the first sub-pixels and the third sub-pixels are alternately disposed in even rows and odd columns, and the second sub-pixels and the fourth sub-pixels are alternately disposed in odd rows and even columns; or,
the first sub-pixels and the third sub-pixels are alternately disposed in even rows and even columns, and the second sub-pixels and the fourth sub-pixels are alternately disposed in odd rows and odd columns.

5. The pixel structure according to claim 4, wherein centers of the first sub-pixels and the third sub-pixels located in the same row or column are in the same line, and centers of the second sub-pixels and the fourth sub-pixels located in the same row or column are in the same line; and
wherein the first sub-pixels, the second sub-pixels, the third sub-pixels and the fourth sub-pixels are arranged uniformly.

6. The pixel structure according to claim 5, wherein,
in the same column, the center of the first sub-pixel is located in the perpendicular bisector of a line connecting the centers of two third sub-pixels adjacent to the first sub-pixel;

in the same row, the center of the first sub-pixel is located in the perpendicular bisector of a line connecting the centers of two third sub-pixels adjacent to the first sub-pixel;

in the same column, the center of the third sub-pixel is located in the perpendicular bisector of a line connecting the centers of two first sub-pixels adjacent to the third sub-pixel; and in the same row, the center of the third sub-pixel is located in the perpendicular bisector of a line connecting the centers of two first sub-pixels adjacent to the third sub-pixel.

7. The pixel structure according to claim 6, wherein the second sub-pixel or the fourth sub-pixel is located in a direction of an oblique angle of 45 degree with respect to the first sub-pixel or the third sub-pixel.

8. The pixel structure according to claim 7, wherein area of the second sub-pixel is the same as that of the fourth sub-pixel, and area of the first sub-pixel is the same as that of the third sub-pixel and greater than that of the second sub-pixel; or, area of the second sub-pixel is the same as that of the fourth sub-pixel, area of the third sub-pixel is greater than that of the first sub-pixel, and area of the first sub-pixel is greater than that of the second sub-pixel.

9. The pixel structure according to claim 8, wherein distance between the first sub-pixel and the second sub-pixel adjacent to each other is equal to distance between the third sub-pixel and the fourth sub-pixel adjacent to each other, and distance between the first sub-pixel and the third sub-pixel adjacent to each other is less than distance between the second sub-pixel and the fourth sub-pixel adjacent to each other.

10. The pixel structure according to claim 1, wherein the basic colors comprise red, green and blue, the basic color of the first sub-pixel is red, the basic color of the third sub-pixel is blue, and the basic colors of the second and the fourth sub-pixels are green.

11. The pixel structure according to claim 1, wherein each of the shapes of the first sub-pixel, the second sub-pixel, the third sub-pixel and the fourth sub-pixel is an axial-symmetric pattern with a symmetry axis extending in the direction in parallel to the row or column direction.

12. The pixel structure according to claim 11, wherein the shapes of the first sub-pixel, the second sub-pixel, the third sub-pixel and the fourth sub-pixel are any one of round shape, triangular shape, quadrangular shape, pentagonal shape, hexagonal shape or octagonal shape or a combination thereof.

13. The pixel structure according to claim 11, wherein the first sub-pixel and the third sub-pixel have quadrilateral or octagonal shape and the shapes of the first sub-pixel and the third sub-pixel are the same, and the second sub-pixel and the fourth sub-pixel have quadrilateral or octagonal shape and the shapes of the second sub-pixel and the fourth sub-pixel are the same.

14. The pixel structure according to claim 1, wherein the first sub-pixel and the second sub-pixel in the first pixel unit are connected to two data lines respectively, and the third sub-pixel and the fourth sub-pixel in the second pixel unit are connected to two data lines respectively, the data lines being used to receive the pixel display information.

15. A display method of the pixel structure according to claim 1.

16. The display method according to claim 15, comprising:
Step S1: from the data source of pixel display information, obtaining theoretical brightness values of colors corresponding to the basic colors of the first sub-pixel and the second sub-pixel in the first pixel unit, and obtaining theoretical brightness values of colors corresponding to the basic colors of the third sub-pixel and the fourth sub-pixel in the second pixel unit;

Step S2: obtaining actual brightness values of the first sub-pixel, the second sub-pixel, the third sub-pixel and the fourth sub-pixel by calculation; and Step S3: inputting the actual brightness values into the first sub-pixel, the second sub-pixel, the third sub-pixel and the fourth sub-pixel to implement the image display.

17. The display method according to claim 16, wherein, in Step S2, the actual brightness values of the second sub-pixel and the fourth sub-pixel are set to the theoretical brightness values of colors corresponding to their basic colors;

the actual brightness value of the first sub-pixel is set to a weighted sum of the theoretical brightness value of the basic color corresponding to the first sub-pixel needed in the first pixel unit and the theoretical brightness value of the basic color corresponding to the first sub-pixel needed in at least one of its adjacent second pixel units; and the actual brightness value of the third sub-pixel is set to a weighted sum of the theoretical brightness value of the basic color corresponding to the third sub-pixel needed in the second pixel unit and the theoretical brightness value of the basic color corresponding to the third sub-pixel needed in at least one of its adjacent first pixel units.

18. The display method according to claim 17, wherein the first pixel unit additionally uses N third sub-pixels from its adjacent second pixel units to display, and the second pixel unit additionally uses N first sub-pixels from its adjacent first pixel units to display; correspondingly, in Step S2, both of the weighted values of the theoretical brightness values of the first and the third sub-pixels are 1/N, wherein N≥1.

19. The display method according to claim 18, wherein the first pixel unit additionally uses one third sub-pixel from its adjacent second pixel unit to display, and the second pixel unit additionally uses one first sub-pixel from its adjacent first pixel unit to display; correspondingly, in Step S2, both of the weighted values of the theoretical brightness values of the first sub-pixel and the third sub-pixel are ½.

20. A display device comprising the pixel structure according to claim 1.

* * * * *